(12) United States Patent
Wijnaendts Van Resandt et al.

(10) Patent No.: US 9,052,608 B2
(45) Date of Patent: Jun. 9, 2015

(54) METHOD AND DEVICE FOR IMAGING A RADIATION-SENSITIVE SUBSTRATE

(75) Inventors: Roelof Wijnaendts Van Resandt, Odenheim (DE); Roland Kaplan, Heidelberg (DE)

(73) Assignee: Heidelberg Instruments Mikrotechnik GmbH, Heidelberg (DE)

( * ) Notice: Subject to any disclaimer, the term of this patent is extended or adjusted under 35 U.S.C. 154(b) by 954 days.

(21) Appl. No.: 13/130,245

(22) PCT Filed: Oct. 23, 2009

(86) PCT No.: PCT/EP2009/063959
§ 371 (c)(1),
(2), (4) Date: Jul. 25, 2011

(87) PCT Pub. No.: WO2010/057740
PCT Pub. Date: May 27, 2010

(65) Prior Publication Data
US 2011/0273688 A1    Nov. 10, 2011

(30) Foreign Application Priority Data

Nov. 19, 2008  (DE) .......................... 10 2008 058 241
May 7, 2009    (DE) .......................... 10 2009 020 320

(51) Int. Cl.
| G03B 27/44 | (2006.01) |
| G03B 27/68 | (2006.01) |
| G03B 27/72 | (2006.01) |
| G03B 27/32 | (2006.01) |

(Continued)

(52) U.S. Cl.
CPC ........ G03F 7/70291 (2013.01); G03F 7/70283 (2013.01); G03F 7/70308 (2013.01); G03F 7/70358 (2013.01); G03F 7/70466 (2013.01)

(58) Field of Classification Search
CPC ............ G03F 7/70116; G03F 7/70383; G03F 7/70391; G03F 7/70283; G03F 7/70291; G03F 7/70308; G03F 7/703058; G03F 7/70466; G03F 7/7015; G03F 7/70141; G03F 7/70158; G03F 7/70358
USPC ....................... 355/46, 52, 53, 55, 67–71, 77; 250/492.1, 492.2, 492.22, 493.1, 548; 430/5, 8, 22, 30, 311, 312, 321
See application file for complete search history.

(56) References Cited

U.S. PATENT DOCUMENTS 4,541,712 A   9/1985  Whitney
6,552,779 B2  4/2003  Mei
(Continued)

FOREIGN PATENT DOCUMENTS

CN        1292102       4/2001
DE   10 2008 017 623    10/2008
(Continued)

Primary Examiner — Christina Riddle
(74) Attorney, Agent, or Firm — Jordan and HamburgLLP

(57) ABSTRACT

A method and apparatus for imaging a radiation-sensitive substrate, wherein a programmable template is projected onto the radiation-sensitive substrate using coherent radiation having a wavelength at which the substrate is radiation sensitive. An overall image of the programmable template having an image grid is displaced simultaneously by an acoustic-optical or electro-optical deflection unit such that multiple projections impinge on the substrate at different positions such that a fine partial grid is created in the image grid on the substrate.

16 Claims, 4 Drawing Sheets

(51) Int. Cl.
*G03F 7/20* (2006.01)
*G03B 27/54* (2006.01)
*G03B 27/52* (2006.01)

(56) References Cited

U.S. PATENT DOCUMENTS

| | | | |
|---|---|---|---|
| 6,574,032 B1* | 6/2003 | Roddy et al. | 359/290 |
| 2002/0012153 A1* | 1/2002 | Sunagawa | 359/204 |
| 2002/0024714 A1* | 2/2002 | Sandstrom et al. | 359/290 |
| 2003/0081303 A1* | 5/2003 | Sandstrom et al. | 359/291 |
| 2003/0206281 A1* | 11/2003 | Jain | 355/53 |
| 2004/0075882 A1* | 4/2004 | Meisburger | 359/290 |
| 2005/0002002 A1* | 1/2005 | Shirota et al. | 355/18 |
| 2005/0168851 A1* | 8/2005 | Sandstrom | 359/855 |
| 2006/0176323 A1* | 8/2006 | Bommersbach et al. | 345/697 |
| 2008/0059096 A1* | 3/2008 | Stenstrom et al. | 702/85 |
| 2008/0079922 A1 | 4/2008 | Sandstrom | |
| 2009/0303452 A1 | 12/2009 | Ljungblad | |
| 2010/0091256 A1* | 4/2010 | Mangold et al. | 355/53 |

FOREIGN PATENT DOCUMENTS

| | | |
|---|---|---|
| JP | 2001-305449 | 10/2001 |
| JP | 2005-518659 | 6/2005 |
| JP | 2008-536188 | 9/2008 |
| WO | WO-2006/117642 | 11/2006 |
| WO | WO-2008/122419 | 10/2008 |

* cited by examiner

METHOD AND DEVICE FOR IMAGING A RADIATION-SENSITIVE SUBSTRATE

FIELD OF THE INVENTION

The invention relates to a method for imaging a radiation-sensitive substrate and to an apparatus for imaging a radiation-sensitive substrate.

BACKGROUND OF THE INVENTION

In a method and an apparatus known from US 2005/0168851 A1 for imaging a radiation-sensitive substrate, a programmable template is illuminated with coherent radiation and projected by means of an optical system onto the substrate that is sensitive to the radiation used. The coherent radiation is split by means of two Bragg cells into a plurality of first and higher-order beamlets and is supplied to the programmable template via a collection lens. The beam bundles radiated from the template are successively directed onto the substrate by means of a scanner, wherein the specific beam bundle and furthermore the substrate are displaced. The programmable template may be a controllable micro-mirror array, for instance, the individual elements of which are embodied spatially separated from one anther. The optical system, constructed from at least two independent groups of lenses, produces an appropriate scaled image on the substrate by overlaying the individual images for each individual element.

Furthermore, known from US 2006/0176 323 A1 are a method and an apparatus having a light source, the diverging beam bundle of which is directed onto a programmable template via a collection lens. There is no expansion of a coherent beam bundle. The output radiation of the programmable template travels onto a movable lens to which linear actuators are allocated. The angle of incidence of the striking beams is changed, and thus the image position is changed, corresponding to the movement of the movable lens. In another exemplary embodiment the change in the image may be brought about by modulation of the optical properties of a plate using integrated optical systems or various electro-optical modulators or acoustic-optical modulators.

Undesired interference effects result from the nature of coherent radiation, especially when the resolution of the optical system is too low, and these interference effects have a negative impact on the quality of the structures produced. At high resolution there is slight overlaying of the individual images so that the interference effects are negligible. However, using this slight overlapping it is not possible to attain a displacement of the structure edges on the substrate by varying the radiation intensity of adjacent individual images. A mechanical method that requires a plurality of exposure processes is described in document DE 10 2008 017 623 A1.

Known from document U.S. Pat. No. 4,541,712 is an apparatus for producing a laser pattern in which a plurality of laser light sources are densely arranged in a non-interfering field. The emitted laser light beams are scanned simultaneously over a region of a target surface by means of an acoustic-optical deflector. After one working cycle, the target surface is moved perpendicular to the scanning direction in order to reposition for the next working cycle.

U.S. Pat. No. 6,552,779 B2 describes a maskless exposure system for digital photolithography. A field of mirrors can be controlled digitally such that a light pattern results in the light reflected by the mirrors. The reflected light pattern is projected by means of a first f-θ lens system onto a rotary mirror that scans the light pattern over an object surface using a second f-θ lens system.

SUMMARY OF THE INVENTION

The object of the present invention is to improve the image resolution and/or to increase the speed of the exposure in a method and in an apparatus for imaging a radiation-sensitive substrate.

The method and apparatus of the present invention attain an improvement in the resolution of the imaged substrate without a reduction in the imaging speed.

The method and apparatus of the present invention do not use a plurality of exposures and the mechanical movement processes necessary for these, but rather use an acoustic-optical or electro-optical deflection unit for displacing the projection on the substrate. Due to this displacement, the radiation energy emitted onto the substrate is controlled more precisely per template element and thus makes possible higher local resolution in the placement of structure edges.

In the method herein for imaging a radiation-sensitive substrate, a programmable template is projected onto the radiation-sensitive substrate using coherent radiation having a wavelength to which the substrate is radiation-sensitive. An entire image of the programmable template, especially with an image grid, is displaced simultaneously by an acoustic-optical or electro-optical deflection unit such that a plurality of projections strike the substrate at different positions so that a fine partial grid is produced in the image grid on the substrate.

The programmable template may in particular be reflexive or a reflexive optical element or may be non-transmissive or opaque. The reflection of the template may be programmable or adjustable. The coherent radiation may indicate interference effects within an entire image. The entire image may comprise or constitute beam bundles that interfere with one another.

The entire image of the programmable template may be reproduced multiple times on the radiation-sensitive substrate. The length of the displacement for producing a partial grid may be smaller than the width of the image grid.

In one preferred embodiment of the method herein, the programmable template is constructed from a one-dimensional grid or a two-dimensional grid of modulator elements. In particular, the direction and/or the amplitude of the coherent radiation may be modified by means of the modulator elements.

In the method herein, a radiation source having temporally continuous output power is used. Alternatively, a radiation source having temporally pulsed output power can be used.

A plurality of beam bundles may be displaced simultaneously by means of the acoustic-optical or electro-optical deflection unit. Moreover, the illumination angle for the programmable template may be modified or adjusted for adjusting the phase angle of the light striking the radiation-sensitive substrate.

An apparatus for imaging a radiation-sensitive substrate includes the radiation-sensitive substrate, a radiation source for emitting coherent radiation having a wavelength to which the substrate is radiation-sensitive, a programmable template, and an optical system for projecting the programmable template illuminated by the coherent radiation onto the radiation-sensitive substrate. Moreover, the apparatus has an acoustic-optical or electro-optical deflection unit that, for simultaneous displacement of an entire image of the programmable template with an image grid, may be initiated such that for producing a fine partial grid in the image grid a plurality of projections strike the substrate at different positions on the substrate.

Preferably, the programmable template is constructed from modulator elements, wherein the modulator elements are formed from micro-mirror array or from a one-dimensional arrangement of controllable diffraction grating.

The radiation source, in particular a laser light source, preferably emits light having a wavelength between 180 nm and 430 nm, especially between 240 nm and 400 nm, preferably between 340 and 395 nm. In the embodiment as a laser light source, it may be a frequency-multiplied laser, especially a frequency-doubled laser. The radiation source in the inventive apparatus may especially emit light in the ultraviolet spectral range, especially UVA, UVB, or UVC light.

The method herein may be attained using a control sequence or a control program for a control unit or a control computer of the inventive apparatus. In other words, the apparatus may include a control unit, especially a control computer with a storage unit in which a computer program is stored that has at least one part that initiates the apparatus so that a method with features or feature combinations in accordance with this depiction of the apparatus is performed.

BRIEF DESCRIPTION OF THE DRAWINGS

Additional advantages and advantageous embodiments and refinements of the invention are depicted using the following description with respect to the figures in which.

DETAILED DESCRIPTION OF THE INVENTION

Figure 1:
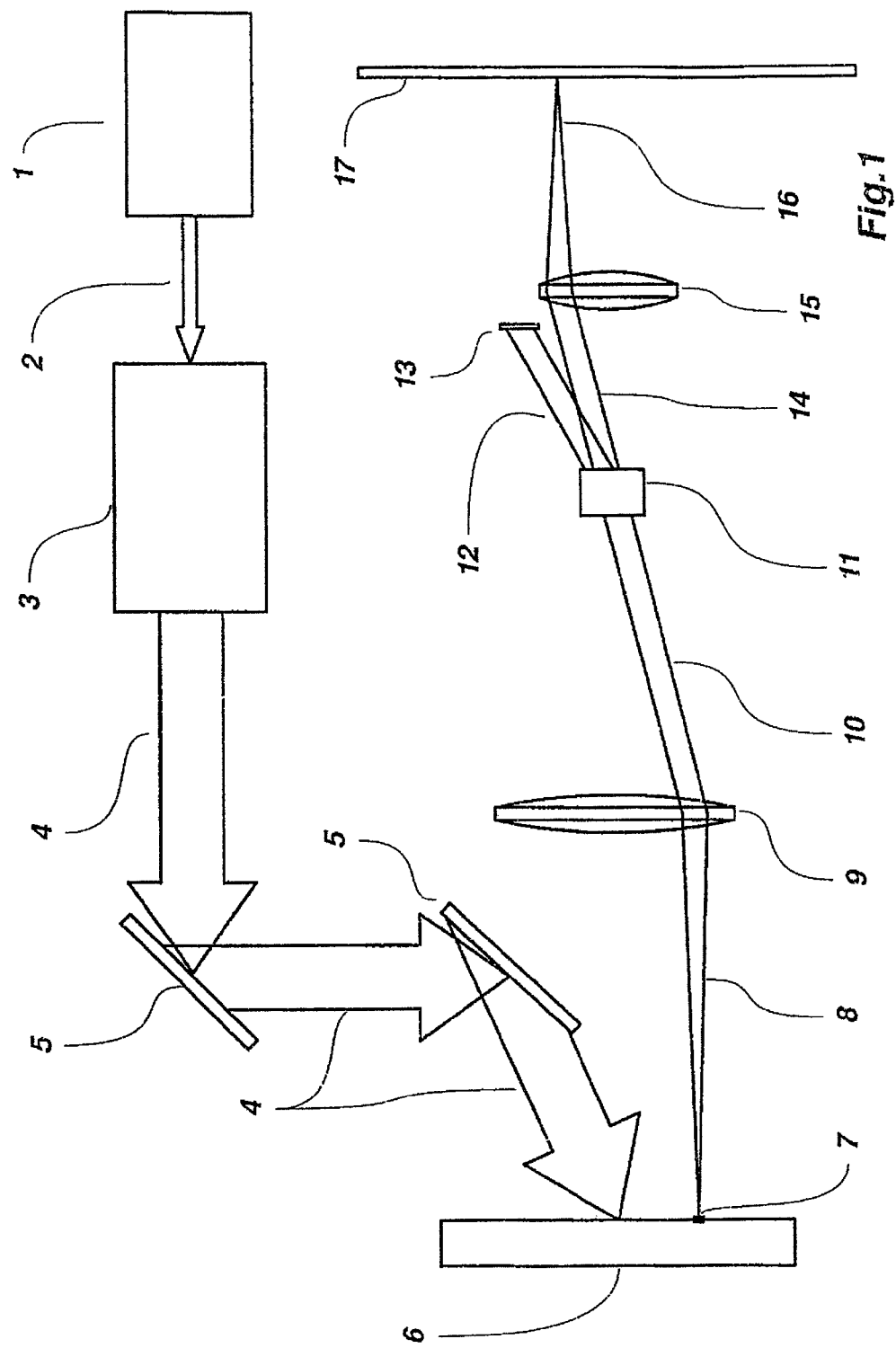
FIG. 1 is an overview of an embodiment of the inventive apparatus for imaging a radiation-sensitive substrate.

The structure of one embodiment of the apparatus for imaging a radiation-sensitive substrate 17, also called an exposure system, proceeds from FIG. 1. The radiation source 1 of the coherent radiation is embodied as a laser with a wavelength of approximately 355 nm. The exiting radiation field 2 is expanded using the optics unit 3 (expansion optics unit) such that all controllable modulator elements of the programmable template 6 may be illuminated. Depending on the mechanical structure, a plurality of mirrors 5 may be required for this in order to direct the expanded radiation field 4 onto the programmable template 6.

For the purpose of simplifying FIG. 1 it is assumed that all depicted components are disposed in the drawing plane. In actuality, however, the components for the illumination beam path, especially the mirrors 5 and the beam bundle 4, do not necessarily have to be in the plane of the projection optics unit, lens 9 and lens 15.

Figure 2:
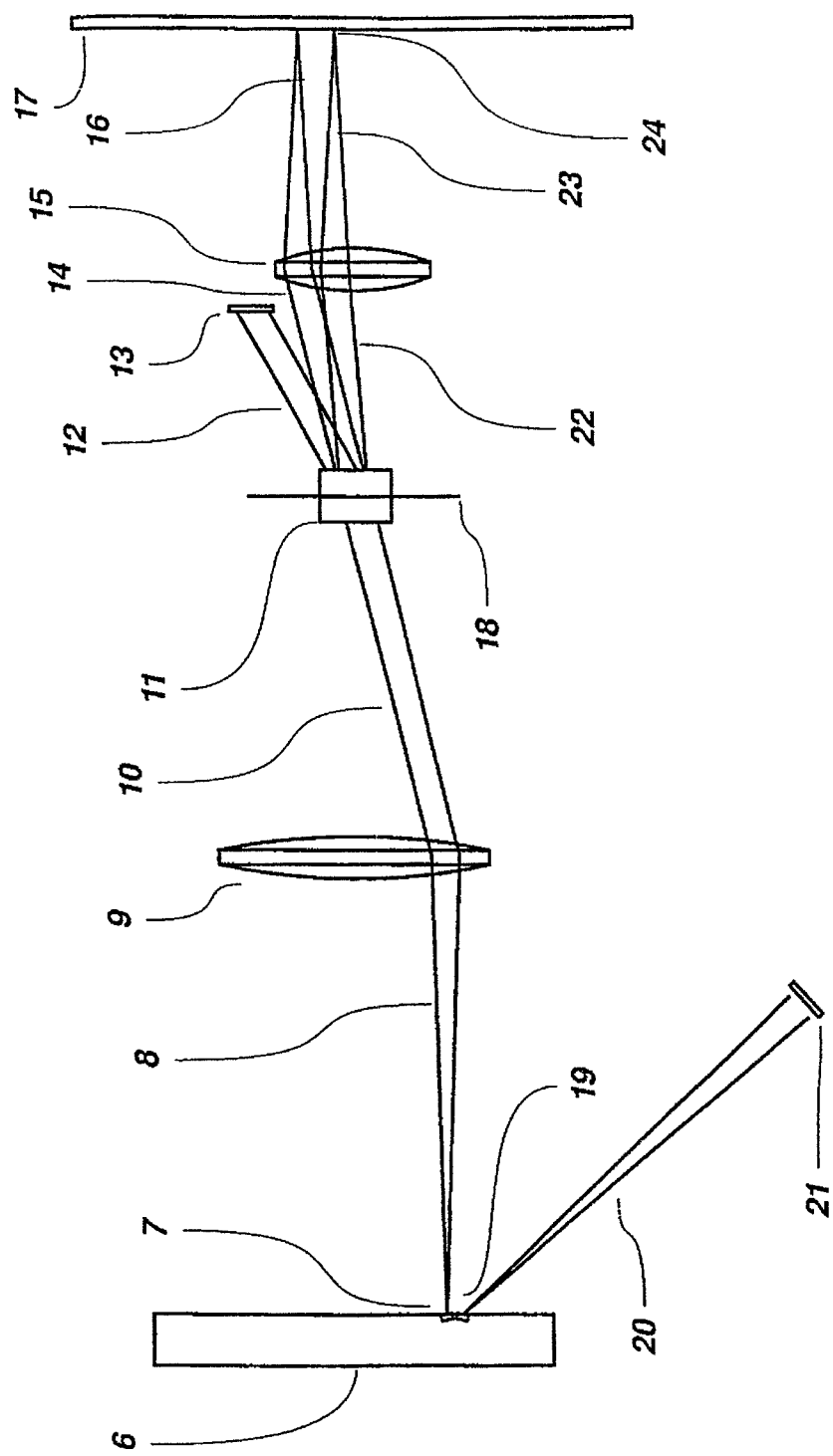
FIG. 2 is a detail of the embodiment of the inventive apparatus for imaging a radiation-sensitive substrate.

The programmable template 6 comprises a plurality of modulator elements 7. These are arranged in a regular grid in the programmable template 6. Corresponding to the ratio of the focal distances of the lens 9 and lens 15, the grid for the programmable template 6 is reproduced to scale on the substrate 17. Each of these modulator elements 7 may be initiated corresponding to the pattern to be created. The illustrated modulator element 7 is activated such that some of the incident radiation is directed towards the substrate. Non-activated modulator elements deflect their portion of the beam not towards the substrate. Details are shown in FIG. 2. The beamlets 8 of the active modulator element strike lens 9. The distance between the lens 9 and the programmable template 6 is equal to the focal length of the lens.

Without limiting universality, the lens 9 and/or the lens 15 may be embodied by a lens group in order to obtain the required optical resolution.

Due to the diffraction on the modulator element 7, the beamlet 8 is divergent and converted to a parallel beam bundle using the lens 9. All incident beamlets are parallel and therefore the output-side beam bundles 10 intersect at the focal plane 18 of the lens 9.

Non-activated modulator elements 19 of the programmable template 6 direct the beam bundle 20 in another direction so that it does not strike the lens 9, but rather is removed from the rest of the beam path by an absorber 21.

Arranged in the focal plane 18 is the acoustic-optical deflection unit 11, and its manner of operation is known. Not shown is a control unit for the deflection unit 11. The control unit activates the deflection unit 11, especially the simultaneous displacement of an entire image from the programmable template with an image grid. The control unit may especially be a control computer or may be controlled by a computer. If no electric signal is applied to the deflection unit 11, the incident beam bundles exit as a zero-order bundles 12. This radiation is removed from the beam path by the absorber 13. If an electrical signal with the correctly selected frequency is applied, the bundles 10 radiates in and exit as first-order bundles 14 and strike lens 15. The position of the lens 15 is selected such that the input-side focal plane coincides with focal plane 18. The radiation-sensitive substrate is disposed in the output-side focal plane of the lens 15. Lens 15 focuses the incident beam bundles on the substrate. The position of the image of the active modulator element results as a function of the angle of incidence of the beam bundle 14 onto the lens 15.

FIG. 2 depicts the details of the beam path around the acoustic-optical deflection unit 11. If an electric signal with a different frequency than in FIG. 1 is assumed and is applied to the acoustic-optical deflection unit, the direction of the beam bundle 22 exiting from the deflection unit changes. Since the beam bundle 22 has a different angle of incidence into the lens 15 than the beam bundle 14, the result is a modified position 24 of the image of the active modulator element on the substrate 17.

For the purpose of simplicity, only one active modulator element is depicted in FIGS. 1 and 2. The programmable template comprises many of these elements. If, for instance, a TI DMD 3000 micro-mirror array is used for the programmable template 6, 1,024 elements are available in one horizontal line. Overall this micro-mirror array comprises 768 cells and thus represents a two-dimensional programmable template 6 having 786,432 individually controllable modulator elements 7.

Another embodiment of the programmable template 6 comprises a one-dimensional arrangement of controllable diffraction gratings with a known type of construction. This type of programmable template 6 provides for instance 1,088 individually controllable modulator elements 7.

It is common to both programmable templates 6 that they are constructed from individually controllable modulator elements. Each of these modulator elements produces a coherent light bundle when it is activated. Lens 9 collects these incident bundles 10 and focuses them on the deflection unit 11.

In contrast to the normal use of the acoustic-optical deflection unit in which only one centrally incident beam bundle is deflected corresponding to the applied frequency of the electrical signal, in the arrangement described herein, there is a displacement of one entire image. If in the normal use significance is placed on the greatest possible angle of deflection, in the arrangement described herein a greatest possible angle of incidence is exploited. In addition to the previously mentioned acoustic-optical deflection units (AOD), which exploit the interaction between ultrasound, phonons and light, and photons, in accordance with the invention herein, it is possible to employ deflection units that are suitable for beam deflection and are preferably based for instance on the electro-optical effect. By applying a voltage, the refractive index of certain crystals changes and the radiation traveling therethrough undergoes a change in direction.

Figure 3B:
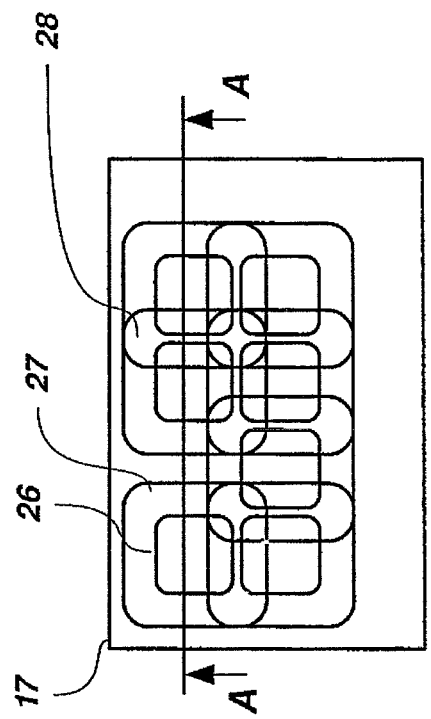
FIG. 3 is an intensity distribution on a substrate with interferences.
Figure 3C:
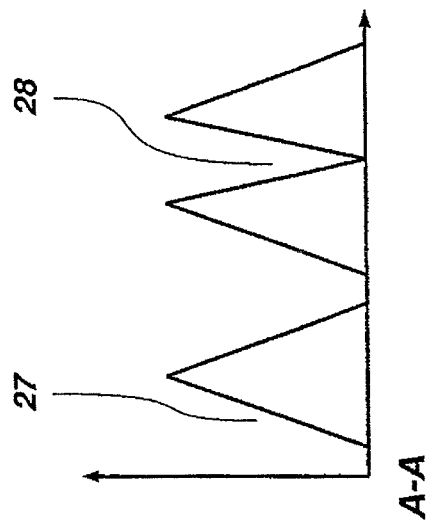
Figure 3A:
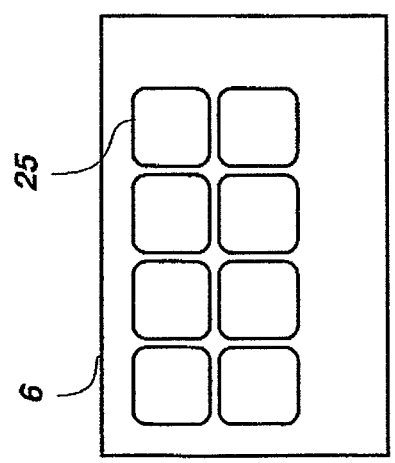

FIG. 3 depicts the intensity distribution that occurs on the substrate 17 when coherent beam bundles overlay one another at low optical resolution. FIG. 3a, to begin with, depicts a view of the programmable template 6 with the individually controllable modulator elements 25. After imaging through lens 9 and lens 15, the individual geometric images 26 of the modulator elements are shown on the substrate 17 in FIG. 3b. It is assumed in this case that a modulator element is not activated and thus does not produce an image in FIG. 3b.

The final optical resolution of the optical system comprising lens 9 and lens 15 results in partial overlaying of the coherent beam bundles 27. Interference occurs in the areas of overlay 28 because the beam bundles overlaying one another have a fixed phase relationship.

FIG. 3c provides a schematically simplified depiction of the resulting intensity along the section A-A. The intensity resulting in the area of overlay 28 is determined by the phase state of the incident fields. By selecting or adjusting the angle of illumination, determined by the arrangement of the mirror 5, especially the adjustable or modifiable arrangement of the mirror 5 upstream of the programmable template 6, the phase state may be adjusted such that the fields in the area of overlay 28 are completely eliminated (see FIG. 3c).

The elimination of the exposure intensity leads to strong fluctuations in the position of structure edges. To prevent this, in accordance with the invention it is suggested to reproduce the image of the programmable template 6 multiple times on each surface to be exposed and thus to displace the image within the image grid 30 using the deflection apparatus 11. Since the exposure processes occur offset temporally from one another, there can be no interference between the radiation fields and the radiation intensities for the individual exposures are summed.

Figure 4A:
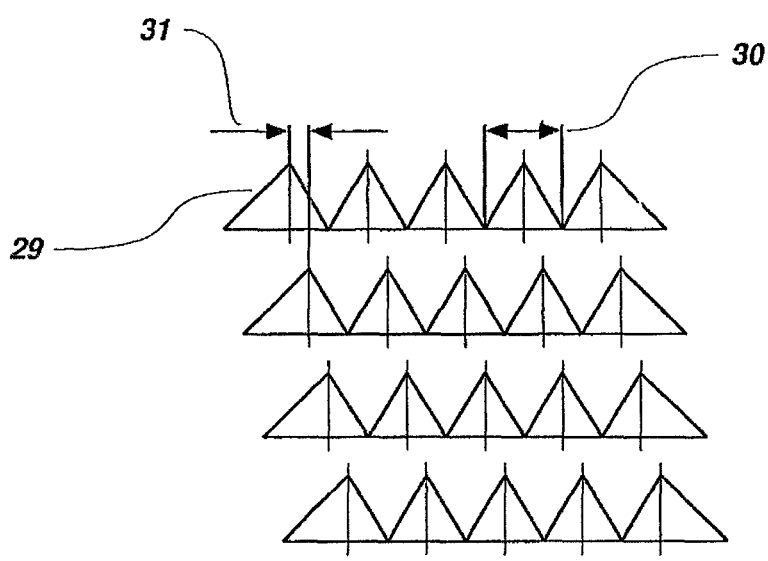
FIG. 4 is an intensity distribution on a substrate after a plurality of projections have been projected onto the substrate.

FIG. 4a depicts four intensity distributions 29 that are projected temporally sequentially onto the substrate. Each intensity distribution 29 results from the interference of the overlapping coherent beam bundles 27. Intensity maximums and intensity minimums that occur in the image grid 30 are clearly recognizable. Each partial exposure is displaced by a partial grid 31 with respect to the basic image grid 30. The length or distance of the displacement is smaller than the width of the image grid 30. The partial grid 31 is in particular finer than the image grid 30.

The amount by which the beam bundle 27 is displaced between a first projection and a second projection may be small enough that intensity maximums in the second projection are produced by those beam bundles that contributed to the adjacent intensity maximums in the first projection.

Figure 4B:
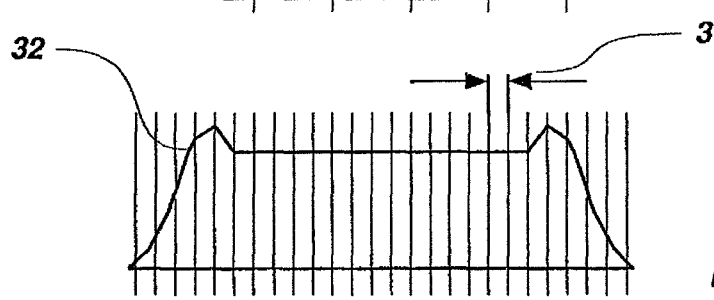

FIG. 4 depicts the resultant intensity distribution 32, which has a resolution corresponding to the partial grid 31. The intensity distribution 32 does not indicate any fluctuations in intensity in the image grid 30. The excessive elevations at the beginning and end of the intensity distribution 32 result from the progression of the intensity that occurs when no interference with adjacent beam bundles arises, and they may be reduced using suitable selection of the radiation dosage for these image points.

The method and apparatus of the present invention are especially distinguished in that a deflection unit that is embodied in particular as an acoustic-optical deflection unit or as an electro-optical deflection unit is used for simultaneously displacing an entire image, that is, a plurality of beam bundles.

The invention claimed is:

1. A method for imaging a radiation-sensitive substrate in which a programmable template is projected as a collective image onto the radiation-sensitive substrate using coherent radiation emitted by a radiation source at a wavelength to which the substrate is radiation-sensitive, the programmable template comprising a plurality of controllable modulator elements, each one of the controllable modulator elements defining an image grid, each one of the controllable modulator elements when active generating an image spanning said corresponding image grid, collectively said plurality of controllable modulator elements producing said collective image defined by respective states of each one of said plurality of controllable modulator elements, the method comprising:

expanding the coherent radiation with an optical unit into an expanded radiation field so that the radiation field is directed onto the programmable template and all controllable modulator elements of the programmable template receive said coherent radiation; and simultaneously deflecting, by using an acoustic-optical or electro-optical deflection unit, said collective image multiple times by a partial grid length spanning less than said image grid, so that on a given portion of the surface of the substrate, a given coherent beam bundle of image elements of the programmable template is displaced said multiple times within said given portion of the substrate surface to repeatedly apply radiation in correspondence to said multiple times, wherein for each one of said multiple times the displacement is for said partial grid length, which is less than that of a single image element of the programmable template so as to accumulate radiation across a given image pixel at said given portion of the substrate surface from said given coherent beam bundle and an adjacent coherent beam bundle, wherein formation of the given image pixel includes interference from the repeatedly applied given and adjacent coherent beam bundle.

2. A method in accordance with claim 1,
wherein a length of the displacement of respective partial exposures for producing the partial image grid is smaller than the width of the entire image grid.

3. A method in accordance with claim 1,
wherein the programmable template comprises a one-dimensional grid or a two-dimensional grid comprising modulator elements.

4. A method in accordance with claim 3,
wherein the direction of the coherent radiation is adjusted by the modulator elements.

5. A method in accordance with claim 3,
wherein the amplitude of the coherent radiation is adjusted by the modulator elements.

6. A method in accordance with claim 1,
wherein the radiation source comprises a device having temporally continuous output power.

7. A method in accordance with claim 1,
wherein the radiation source comprises a device having temporally pulsed output power.

8. A method in accordance with claim 1,
wherein the plurality of beam bundles is displaced simultaneously by deflection of the acoustic-optical or electro-optical deflection unit.

9. A method in accordance with any one of the foregoing claims 1-8,
wherein the illumination angle for the programmable template is adjusted for adjusting the phase angle of the light striking the radiation-sensitive substrate.

10. An apparatus for carrying out the method of claim 9, comprising:
said radiation source, said radiation source being for emitting coherent radiation having a wavelength to which the substrate is radiation-sensitive;
said programmable template, comprising a plurality of controllable modulator elements, each one of the controllable modulator elements defining an image grid, each one of the controllable modulator elements when active generating an image spanning said corresponding image grid, collectively said plurality of controllable modulator elements producing a collective image defined by respective states of each one of said plurality of controllable modulator elements;
an optical system for projecting the programmable template illuminated by the coherent radiation onto the radiation-sensitive substrate as said collective image;
said acoustic-optical or electro-optical deflection unit, said acoustic-optical or electro-optical deflection unit being for displacing said collective image of the programmable template multiple times by a partial grid length spanning less than said image grid; and
said optical unit for expanding the coherent radiation into a radiation field and directing the coherent radiation onto the programmable template so that all of the controllable modulator elements of the programmable template receive said coherent radiation;
wherein the deflection unit is configured so that on a given portion of the surface of the substrate, a given coherent beam bundle of image elements of the programmable template is displaced said multiple times within said given portion of the substrate surface to repeatedly apply radiation in correspondence to said multiple times, wherein for each one of said multiple times the displacement is for partial grid length, which is less than that of a single image element of the programmable template so as to accumulate radiation across a given image pixel at said given portion of the substrate surface from said given coherent beam bundle and an adjacent coherent beam bundle, wherein formation of the given image pixel includes interference from the repeatedly applied given and adjacent coherent beam bundle.

11. An apparatus for carrying out the method of any one of claims 1 through 8, comprising:
said radiation source, said radiation source being for emitting coherent radiation having a wavelength to which the substrate is radiation-sensitive;
said programmable template, comprising a plurality of controllable modulator elements, each one of the controllable modulator elements defining an image grid, each one of the controllable modulator elements when active generating an image spanning said corresponding image grid, collectively said plurality of controllable modulator elements producing a collective image defined by respective states of each one of said plurality of controllable modulator elements;
an optical system for projecting the programmable template illuminated by the coherent radiation onto the radiation-sensitive substrate as said collective image;
said acoustic-optical or electro-optical deflection unit, said acoustic-optical or electro-optical deflection unit being for displacing said collective image of the programmable template multiple times by a partial grid length spanning less than said image grid; and
said optical unit for expanding the coherent radiation into a radiation field and directing the coherent radiation onto the programmable template so that all of the controllable modulator elements of the programmable template receive said coherent radiation;
wherein the deflection unit is configured so that on a given portion of the surface of the substrate, a given coherent beam bundle of image elements of the programmable template is displaced said multiple times within said given portion of the substrate surface to repeatedly apply radiation in correspondence to said multiple times, wherein for each one of said multiple times the displacement is for partial grid length, which is less than that of a single image element of the programmable template so as to accumulate radiation across a given image pixel at said given portion of the substrate surface from said given coherent beam bundle and an adjacent coherent beam bundle, wherein formation of the given image pixel includes interference from the repeatedly applied given and adjacent coherent beam bundle.

12. An apparatus for imaging a radiation-sensitive substrate, comprising:
a radiation source for emitting coherent radiation having a wavelength to which the substrate is radiation-sensitive;
a programmable template comprising a plurality of controllable modulator elements, each one of the controllable modulator elements defining an image grid, each one of the controllable modulator elements when active generating an image spanning said corresponding image grid, collectively said plurality of controllable modulator elements producing a collective image defined by respective states of each one of said plurality of controllable modulator elements;
an optical system for projecting the programmable template illuminated by the coherent radiation onto the radiation-sensitive substrate as said collective image;
an acoustic-optical or electro-optical deflection unit for displacing said collective image of the programmable template multiple times by a partial grid length spanning less than said image grid; and
an optical unit for expanding the coherent radiation into a radiation field and directing the coherent radiation onto the programmable template so that all of the controllable modulator elements of the programmable template receive said coherent radiation; and
wherein the deflection unit is configured so that on a given portion of the surface of the substrate, a given coherent beam bundle of image elements of the programmable template is displaced said multiple times within said given portion of the substrate surface to repeatedly apply radiation in correspondence to said multiple times, wherein for each one of said multiple times the displacement is for partial grid length, which is less than that of a single image element of the programmable template so as to accumulate radiation across a given image pixel at said given portion of the substrate surface from said given coherent beam bundle and an adjacent coherent beam bundle, wherein formation of the given image pixel includes interference from the repeatedly applied given and adjacent coherent beam bundle.

13. An apparatus for imaging a radiation-sensitive substrate in accordance with claim 12,
wherein the programmable template comprises modulator elements formed from a micro-mirror array.

14. An apparatus for imaging a radiation-sensitive substrate in accordance with claim 12,
wherein the programmable template comprises modulator elements formed from a one-dimensional arrangement of controllable diffraction grating.

15. An apparatus for imaging a radiation-sensitive substrate in accordance with claim 12,
wherein the radiation source emits light having a wavelength between 180 nm and 430 nm.

16. An apparatus for imaging a radiation-sensitive substrate, comprising:
a radiation source for emitting coherent radiation having a wavelength to which the substrate is radiation-sensitive;
a programmable template receiving said coherent radiation and having a plurality of individually-controllable modulator elements that respectively define whether corresponding portions of said received coherent radiation are projected from said programmable template, each one of said corresponding portions that is projected from said programmable template defining a geometric image to result in a plurality of geometric images, each one of said corresponding portions that is projected from said programmable template cumulatively forming, with each other one of said corresponding portions that is projected from said programmable template, a bundle of coherent radiation corresponding to an entirety of the programmable template;
an optical system receiving the coherent radiation projected from said programmable template, the optical system projecting said coherent radiation received from said programmable template onto the radiation-sensitive substrate, wherein said coherent radiation projected from said optical system results in said plurality of geometric images on said substrate, wherein partial overlay among said plurality of geometric images results in interference so that an intensity distribution across an area of the substrate corresponding to a given one geometric image among said plurality of geometric images varies according to a phase state of the coherent radiation from said given one geometric image and an adjacent one or more geometric images among said plurality of geometric images overlaying said given one geometric image, said given one geometric image defining a corresponding image grid on said substrate;
an acoustic-optical or electro-optical deflection unit that displaces as a whole said bundle of coherent radiation, corresponding to said entirety of the programmable template, multiple times in increments of a length less than a span of said corresponding image grid so as to accumulate radiation across a given image pixel portion of the substrate that accounts for effects to intensity distribution from said interference at said each one of said geometric images; and
an optical unit for expanding the coherent radiation output from the radiation source into a radiation field and directing the coherent radiation onto the programmable template so that all of the individually-controllable modulator elements of the programmable template receive said coherent radiation; and
wherein for each one of said multiple times, a modulation state of each one of said individually-controllable modulator elements is unchanged; and
wherein said imaging of said radiation-sensitive substrate corresponds to the accumulation of said coherent radiation during said multiple times that said acoustic-optical or electro-optical deflection unit displaces as said whole said bundle of coherent radiation.

* * * * *